United States Patent

Valaris

[11] Patent Number: 5,475,915
[45] Date of Patent: Dec. 19, 1995

[54] METHOD FOR INCREASING EXTRUSION YIELD IN FORMING A SUPERCONDUCTING ROD

[75] Inventor: Peter Valaris, Southbury, Conn.

[73] Assignee: IGC Advance Superconductors, Inc., Waterbury, Conn.

[21] Appl. No.: 332,250

[22] Filed: Oct. 31, 1994

[51] Int. Cl.⁶ .................................. H01L 39/24
[52] U.S. Cl. .......................... 29/599; 505/929
[58] Field of Search .................... 29/599; 505/929

[56] References Cited

U.S. PATENT DOCUMENTS

| | | |
|---|---|---|
| 3,471,925 | 10/1969 | Bindari . |
| 3,514,850 | 6/1970 | Barber et al. ............... 505/929 X |
| 3,618,206 | 11/1971 | Gubler et al. . |
| 3,623,221 | 11/1971 | Morton et al. ............... 505/929 X |
| 3,837,066 | 9/1974 | Mori et al. ............... 29/599 |
| 5,116,429 | 5/1992 | Wong ............... 29/599 |
| 5,369,088 | 11/1994 | Mukai et al. ............... 29/599 X |

FOREIGN PATENT DOCUMENTS

| | | |
|---|---|---|
| 4-129105 | 4/1992 | Japan ............... 29/599 |
| 4-259709 | 9/1992 | Japan ............... 505/929 |
| 4-306512 | 10/1992 | Japan ............... 29/599 |
| 5-76926 | 3/1993 | Japan ............... 29/599 |
| 5-307917 | 11/1993 | Japan ............... 505/929 |
| 1280583 | 7/1972 | United Kingdom . |

Primary Examiner—Carl J. Arbes
Attorney, Agent, or Firm—Helfgott & Karas

[57] ABSTRACT

A cylindrical billet of superconducting material is enclosed by a copper sheath circumferentially, and by a lid and nose of copper at its longitudinal ends. A short cylindrical nose piece of lesser diameter than the billet, is attached at the billet's front end. At the rear end of the billet, an annular ring of copper is positioned. The billet is enclosed in a liner leading to a convergent conical die. Longitudinal force is applied by a ram to the annular ring, which pushes against the outer periphery of the billet at the rear end in a direction toward the die orifice. The stepped nose piece deforms against the die. During an initial period wherein no extrusion takes place, the nose piece exerts an opposite reactive force on the center of the billet, moving the center material toward the ram. As a result of these two opposite actions on the billet, the central longitudinal portion of the billet is pushed back (upset) toward the ram and deforms into the opening of the annular ring. As ram force further increases, the billet breaks through the die opening and actual extrusion of superconducting rod commences. As a result of using a complementary combination of annular ring and stepped nose piece, wherein the stepped nose piece diameter approximately equals the diameter of the annular ring opening product yield is significantly increased.

21 Claims, 3 Drawing Sheets

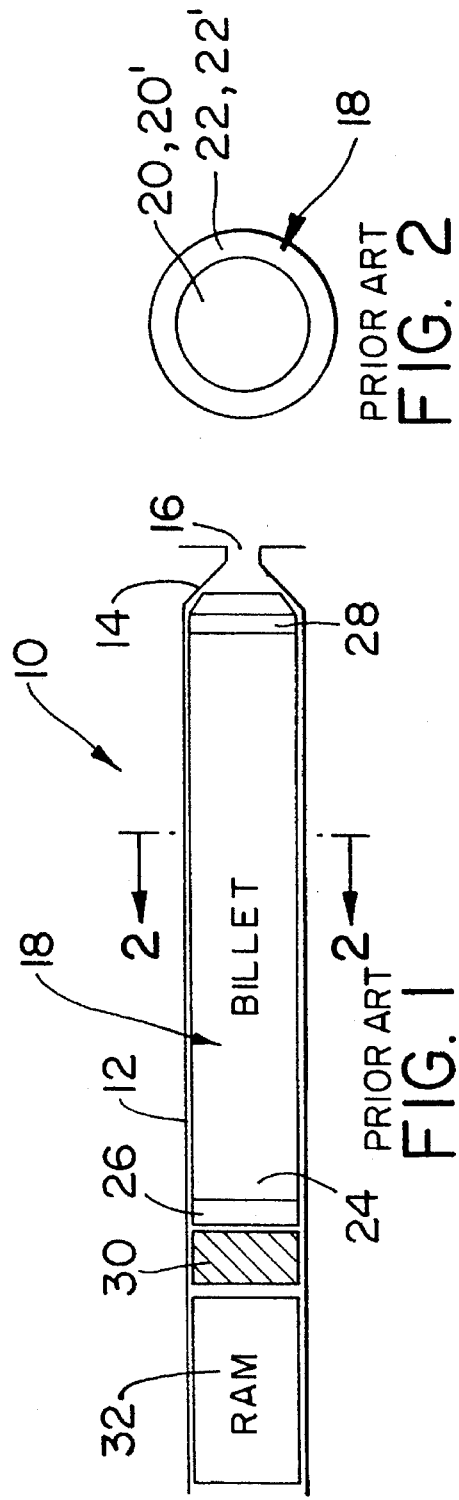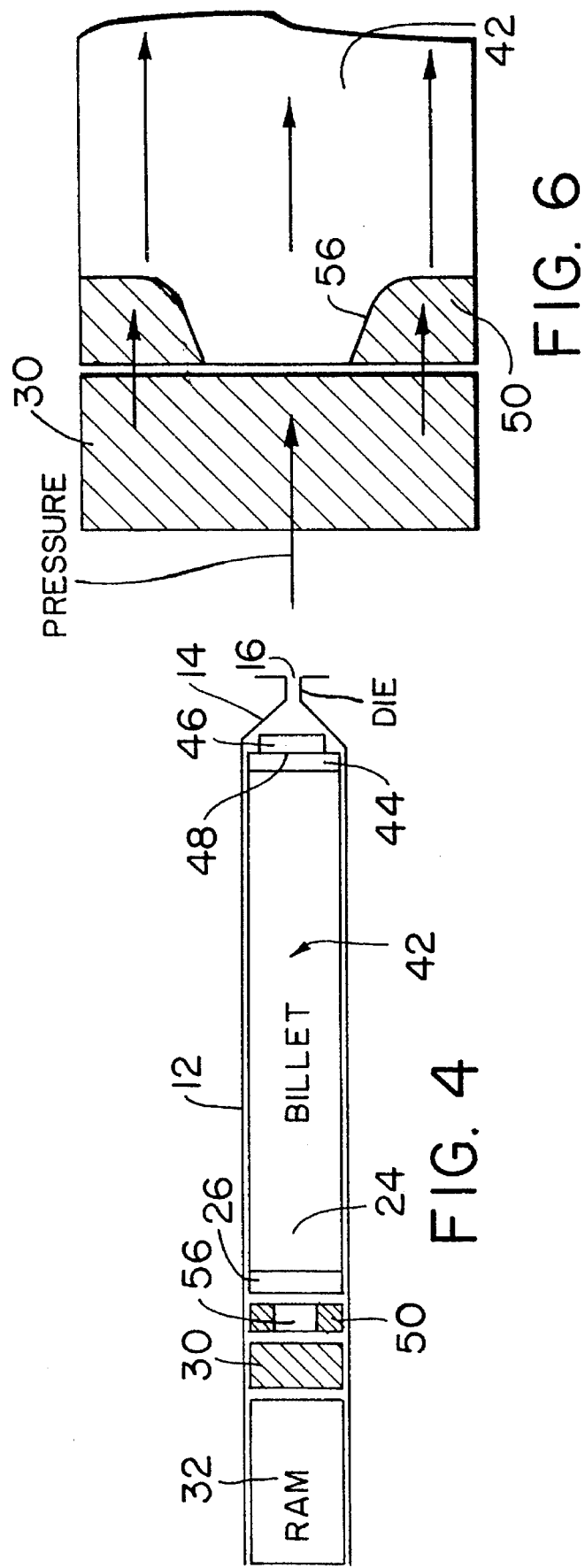

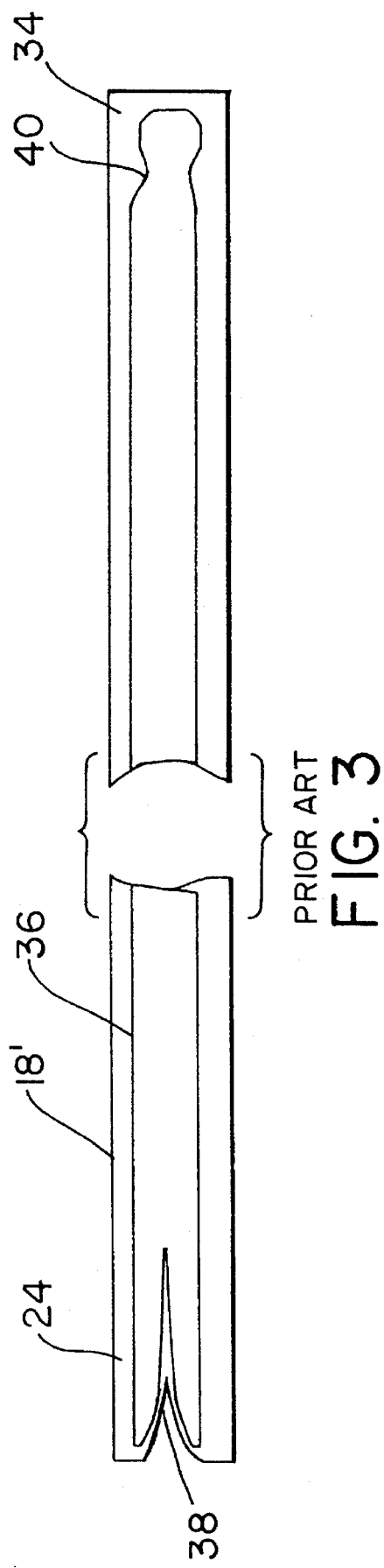
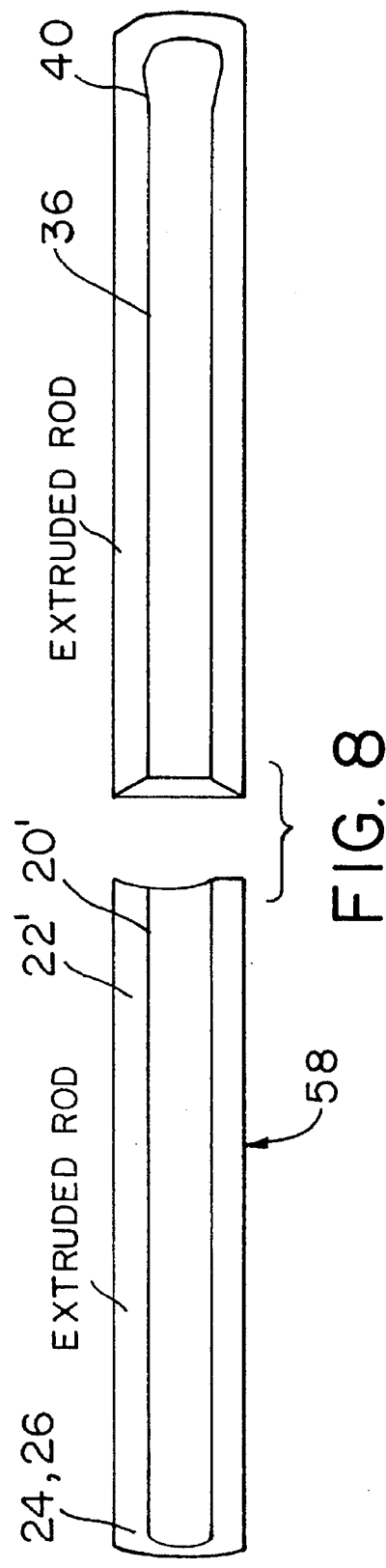

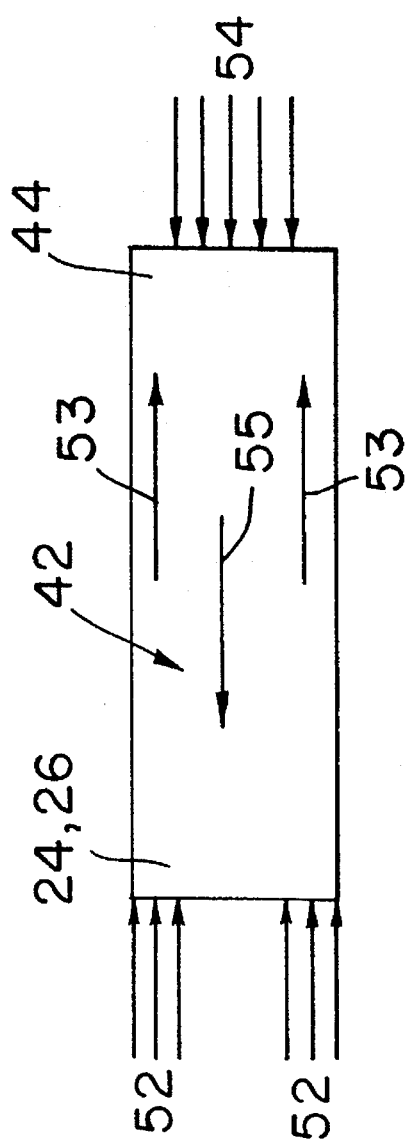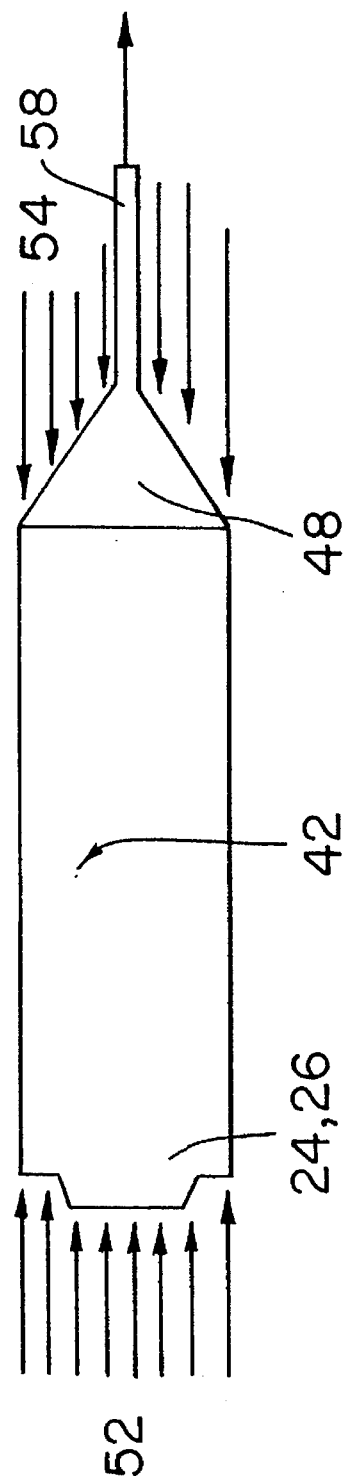

METHOD FOR INCREASING EXTRUSION YIELD IN FORMING A SUPERCONDUCTING ROD

BACKGROUND OF THE INVENTION

Both the mechanical and electrical properties of many superconducting materials make it advantageous to combine the superconductor with a support material, such as copper. In this way, mechanical support is provided for the superconducting material that may be inherently structurally weak. And should a superconductor revert to normal conduction for any of the well-known reasons, whereby the electrical resistance of the previously superconducting element suddenly increases drastically, the current may be by-passed, and heat absorbed by the copper.

Therefore, in the prior art it is known to produce superconducting rods that comprise a core including superconducting material, in monofilament or multifilament constructions, enclosed in a sheath of highly conductive material, such as copper, by extrusion of a billet through a die. Copper has good extrusion qualities as well as high electrical and thermal conductivity and good heat capacity.

As a result of extruding a billet of superconducting material that has been surrounded with a highly conductive sheath and end caps, the central superconducting material becomes fully bonded to the external copper at the atomic level to an extent that the two components cannot be pulled apart. Thus, the extruded product provides an advantageous solution to the problems associated with superconducting materials, as stated.

However, extrusion processes to produce superconducting rods present difficulties in that direct, indirect or hydrostatic extrusion of assembled billets, that is, monofilament composites or multifilament composites, results in yields of steady state material that are less than 90%, when using conventional prior art technology. The term "steady state material" refers to extruded rods that have, along their length, a generally uniform cross section within prescribed limits of proportionality between the superconducting core and the conventionally conducting sheath.

In the prior art, end effects of extrusion render as scrap both the beginning and the tail end of the extruded rod. The ends of the rod do not have the required uniformity of physical characteristics. In particular, at the tail end of the billet, so-called "tubing" occurs following lengths of steady state, acceptable material. In "tubing", copper from the original sheath or matrix material is drawn into the center of the superconducting alloy core, or a void exists, and usually more than 6–8% of the billet length must be cropped off the tail end after extrusion before this undesirable end effect disappears and the extruded material has acceptably uniform qualities.

At the leading end of the billet, the extruded rod has what is known as a "dog bone" effect before the physical characteristics become uniformly acceptable. Further, in preparing some billets for extrusion, a diffusion barrier, typically of Nb or Ta, is introduced between the superconducting core and the outer sheath of copper so as to prevent diffusion of copper into the core and vice versa, whereby a reaction between titanium and copper, for example, may be prevented. At the leading end of the extruded rod, the initial lengths may lack the diffusion barrier before there is a transition to material of acceptable cross sectional quality. It is generally necessary that approximately 4–6% of the billet length be cropped off at the leading end until a fully formed diffusion barrier appears in the extruded rod.

Thus, in the prior art, in the order of 10% or more of the entire drawn rod is unusable because of unacceptable cross sectional geometry, that is, improper ratios of copper and core material and/or absence of the diffusion barrier at both ends of the rod. As the materials, especially the superconducting core materials, are quite expensive, such extrusion losses have considerable impact on the cost of the finished superconducting products, and its ultimate applications.

The distortions from the desired physical characteristics are a direct result of differences in flow and tensile properties at the extrusion temperature between the core, for example, a NbTi ingot or multiple of NbTi rods, and the shell, for example, copper. The extent of the distortions at both ends of the extruded rod is also dependent upon parameters such as die angle, percentage of area reduction from the original billet to the finished rod, speed of extrusion, and coefficient of friction.

What is needed is a billet extrusion method that provides higher yields of usable superconducting rod materials.

SUMMARY OF THE INVENTION

It is an object of the present invention to provide an improved method for extruding superconducting rod whereby the extrusion yield is significantly improved.

It is a further object of the invention to provide an improved method for increasing extrusion yield in forming superconducting rod by reducing the wastage at both the head and tail ends of the extruded product, but primarily the tail end where the "tubing effect" has not been previously addressed.

It is a further object of the invention to provide an improved method for increasing extrusion yield in forming a superconducting rod, wherein conventional extrusion apparatus is utilized.

In the method in accordance with the invention, a cylindrical billet of superconducting material, either monofilament or multifilament, is enclosed by a copper sheath circumferentially, and by a lid and nose of copper at its longitudinal ends. A diffusion barrier of tantalum or niobium provides a concentric layer which isolates the superconducting core from the outer sheath to prevent chemical interaction between them. A stepped copper nose piece, that is, a short cylinder of lesser diameter than the composite billet, is attached at the billet's front end, that is, onto the copper nose. At the rear end of the billet, an annular ring of copper, that is, a copper donut, is positioned between the tail end of the billet and the copper follower block. The copper donut and copper follower block are introduced warm or cold.

The billet is enclosed, as is conventional, in a liner that leads to a convergent cone section and then to a circular die through which the billet will be extruded. At the rear of the billet, behind the billet lid and copper donut, is placed a copper follower block upon which the ram of an extrusion apparatus will exert its force.

As the longitudinal force exerted by the ram is increased, the billet is compressed and expands laterally to fill the liner and eliminate voids; the stepped nose piece presses and becomes deformed against the cone of the die. However, there is an initial period wherein no extrusion takes place while the internal pressures caused by the ram increase. During this initial period, the stepped nose piece, pressing against the cone, exerts an opposite force on the center of the billet, tending to move the center of the billet toward the ram. Simultaneously, the annular surface of the donut pushes against the outer periphery of the billet at the rear end in a direction toward the die orifice.

As a result of these two opposite actions on the billet, the central longitudinal portion of the billet is pushed back (upset) toward the ram and deforms into the opening of the donut, being aided in this upset operation by the opposite force of the donut pushing on the outer periphery of the billet, toward the die opening. The billet has now been formed to a profile optimizing the flow characteristics of the composite.

As ram force further increases, the billet breaks through the die opening and actual extrusion commences. A superconducting rod of much less diameter than the initial billet is produced.

As a result of using a complementary combination of the donut and the stepped nose piece, wherein the diameter of the stepped nose piece approximately equals the diameter of the opening in the donut, the yield of the resultant product is substantially increased over the prior art. "Dog boning" is reduced and "tubing" is eliminated. A major portion of this improvement in efficiency occurs at the rear end of the extruded rod by eliminating the tubing effect, although yield efficiency is also improved at the front end. Overall yields are improved in the range of 3% to 6%, which is a significant amount when considering the high cost of the materials.

Basic to this invention are the simple geometrical shapes of the donut and stepped nose piece that under extrusion ram pressure simultaneously with the billet, deform to provide the composite billet with an optimized flow profile before extrusion begins.

The invention accordingly comprises the several steps, in the relation of one or more of such steps with respect to each of the others thereof, which will be exemplified in the method hereinafter disclosed, and the scope of the invention will be indicated in the claims.

BRIEF DESCRIPTION OF THE DRAWINGS

For a fuller understanding of the invention, reference is had to the following description taken in connection with the accompanying drawings, in which:

FIG. 1 is a schematic representation of an apparatus and billet of the prior art for extruding a superconducting rod;

FIG. 2 is a section taken through the apparatus and billet of FIG. 1 along the line 2—2;

FIG. 3 is a longitudinal cross-sectional view of a superconducting rod produced by the prior art apparatus of FIG. 1;

FIG. 4 is a schematic representation of an apparatus in accordance with the invention for extruding a superconducting rod;

FIG. 5 is a vector diagram of forces acting on the billet in the apparatus of FIG. 4 at commencement of the extrusion process in accordance with the invention;

FIG. 6 is an enlarged schematic representation of the tail end of a billet during the extrusion process in accordance with the invention;

FIG. 7 is a vector diagram of the billet during the process of extrusion in accordance with the invention; and FIG. 8 is a longitudinal cross-sectional view of a superconducting rod extruded with the apparatus and process in accordance with the invention.

DESCRIPTION OF PREFERRED EMBODIMENTS

In FIG. 1, an apparatus for extruding a superconductor rod includes a liner 12, which is a circular cylinder, connected to a cone 14 that converges to an orifice 16 of an extrusion die.

A billet 18, which is a composite of a monofilament or a multifilament core 20 and a sheath or casing 22 of copper, fits concentrically in the liner 12. The rear end 24 of the billet 18 has a capping lid or disk 26, also of copper, and the front end of the billet 18 has a capping nose or lid 28 that includes a forward taper somewhat paralleling the taper of the cone 14. A follower block 30 is positioned between the billet 18 and a driving ram 32 of the extrusion apparatus 10.

When an increasing force is applied to the billet 18, which is at an elevated temperature, by the ram 32, this force is distributed over the entire disk or lid 26 by the follower block 30. The billet expands to fill the liner 12 and is pushed toward the orifice 16 so that the leading end 28 of the billet 12 conforms to the internal shape of the cone 14. The cone 14 applies reactive forces to the billet 18 in a direction opposite to the forces applied by the ram 32. At the leading end, these opposed forces begin at the outer periphery of the billet and gradually are applied over a larger area as the leading end 28 of the billet 18 conforms to the contours of the cone 14.

The extruded rod 18' has cross-sectional characteristics as illustrated in FIG. 3. At the rear or tail end 24 of the billet, "tubing" has occurred before a steady state cross-section 36 begins. Copper from the sheath or matrix material is drawn into the core center 38 and more than 6% of the billet must be cropped off before the tubing end effect disappears.

At the leading end 34 of the billet 18', there is a dog bone effect 40 wherein in single filament superconductor billets, with a diffusion barrier typically of Nb or Ta at the interface of the sheath 22 and core 20, the leading end material lacks a diffusion barrier. A fully formed diffusion barrier between the normally conducting copper and the superconducting core material does not appear until more than 4% of the extended billet 18' is cropped off. Thus, approximately 10% or more of a costly material becomes scrap when using the prior art procedures.

In the method in accordance with the invention, with reference to FIGS. 4–8, a billet 42, which is substantially similar to the billet 18 of FIG. 1, is inserted in the liner 12 for extrusion into a superconducting rod 58. Portions of the billet 42 that are similar to those in billet 18 are given the same reference numerals in the following description.

The billet 42 includes a core 20 surrounded by a sheath 22 as in FIG. 2. A disk or lid 26 caps the sheathed core at the end 24 proximate the ram 32 and a lid 44 encloses the sheathed core at the end proximate the orifice 16. The lid 44 is not tapered as is the lid 28 in FIG. 1. Thus, a simple cylindrical disk suffices for use in the method in accordance with the invention. A second disk 46 connects to the lid 44 to provide, in combination, what is conveniently called a "stepped nose" 48. As illustrated in FIG. 4, the leading edge of the second disk 46 of the stepped nose 48 will initially press against the cone 14 when the ram 32 is activated.

An annular ring or donut 50 is placed in the liner 12 between the follower block 30 and the rear lid 26 of the composite billet 42.

In the extrusion process in accordance with the invention, the composite billet 42, with the stepped nose 48 including the second disk 46, is placed at an elevated temperature in the liner 12, with an unheated donut 50 at the tail end 24.

As increasing pressure is applied by the ram 32, and prior to any extrusion of material through the orifice 16, the billet is upset, that is, it expands to fill the liner 12 where clearance may exist.

Illustrated in FIG. 5, is a free body diagram of the billet 42 itself, less the second disk 46. An annular ring of forces 52 is applied by the donut 50 to the rear end 24, 26 of the billet 42, whereas at the front end lid 44 of the billet 42, the second disk 46 applies opposite reactive forces 54 to the billet 42. The outside diameter of the second disk 46 at the stepped nose 48 is less than the outside diameter of the billet 42 and of the donut 50.

Thus, material at the outer periphery of the billet 42, urged by the forces 52, tends to move toward (arrows 53) the leading end 44 of the billet and into the cone 14 to fill the voids therein. Concurrently, the central portion of the billet 42 is forced by the reactive forces 54 toward (arrow 55) the rear end 24, 26, and billet material is forced into the central opening 56 of the donut 50 (FIG. 6). In the process, the central opening of the donut 50 becomes deformed, as illustrated in FIG. 6.

At this point in the process, extrusion of superconductive rod 58 through the orifice 16 begins. At that time, the billet 42 has a configuration as illustrated in FIG. 7. The forces 52 are distributed to act on the entire area at the rear end 24, 26 of the billet 42, and at the front end 48, the reactive forces 54 act on the conical end of the billet 42, which has deformed to fill the cone 14.

As a result of this initial upset of material, prior to actual extrusion of the rod 58 through the orifice 16, material at the central cross-sectional area of the original composite billet is pushed back. Thereby, the extruded rod 58 exhibits a longitudinal cross-section as in FIG. 8. The amount of dog boning 40 at the front end is significantly reduced. That is, a uniform cross-section 36 is produced with less scrap. At the tail end 24, 26 the upset characteristics of the extrusion process has greatly reduced the tubing effect and filled the void area that existed in FIG. 3. The yield from a billet extrusion is increased by the method in accordance with the invention from approximately 90% to a range of approximately 93–97%. Thus, considerable savings in material costs are effected.

The extruded rod 58 is of substantially reduced diameter as a result of passing through the orifice 16 and still includes a sheath 22' of conductive material, for example copper and a central superconducting core 20', surrounded by a diffusion barrier (not shown) of Nb or Ta, as described above. As stated, the process may be practiced on monofilament and multifilament composite billets.

The extent of the distortion in physical characteristics is also dependent upon extrusion parameters such as die angle, percentage of area reduction, speed of extrusion and coefficient of friction.

The pre-extrusion upset or backward material flow in the liner 12 optimizes the flow profile of the front and rear of the billet 42 before the pressure builds up and before the rod 58 emerges through the orifice 16. Before actual extrusion of rod through the orifice 16 begins, movement occurs simultaneously in three regions within the liner 12. Namely, the billet 42 upsets and void spaces in the liner 12 are eliminated. Pressure transmitted through the donut 50 begins material flowing into the cone 14 leading to the orifice 16. Finally, back flow occurs into the central opening 56 of the donut 50 causing the center portion of the billet 42 to upset, away from the orifice 16.

The stepped nose 48 and the donut 50 complement each other in providing the upset of material and back flow that fills the donut's center 56. Thus, the area of the disk 46 in the stepped nose 48 is most effective when it approximately equals the area of a central opening 56 in the donut 50, although yield is improved when the disk is greater or less in area than the opening 56.

The profiles at the rear and forward ends of the billet 42 are set once back flow ceases and actual extrusion of rod 58 begins. The amount of usable yield improvement depends upon the donut geometry, material of which the donut is made, and the desired cross-sectional ratio of sheath to superconductor in the finished product. The thicknesses of the donut 50 and stepped nose 48 are also important.

It is significant that substantial gains in yield are made from the tail end 24, 26 of the billet, where little effort has been made in the prior art to improve yield. The amount of billet material that is upset into the donut 50 appears to be directly related to improved yield.

In extrusions resulting in improved yield using a composite billet of CU-NbTi with a Nb diffusion barrier at the copper-NbTi interface, billet diameter was 10 inches and length 32 inches. The thickness of the donut 50 was in a range of 3–10% of the billet length and the cross-sectional area of the central opening 56 in the donut 50 was in the range of approximately 45%–65% of the cross-sectional area of the composite billet 42. The billets including the stepped nose 48 were preheated to an extrusion temperature of 750° C., while the donut 50 was at room temperature. Extrusion of superconducting rod 58 occurred when the pressure applied at the ram 32 exceeded 136 KSI.

An initial diffusion layer of approximately 0.030 inches prior to extrusion resulted approximately in a 0.003 inch layer after extrusion in those regions where the dimensions in the extruded rod were stabilized.

The billet can be extruded into a rod approximately 200 feet long and having an outside diameter in the order of approximately 1.0 to 1.3 inches.

When extruding a monofilament billet by a method in accordance with the invention, yield was increased by 6% approximately and when extruding a multifilament billet with a copper to non-copper ratio 3 of approximately 4 to 1, an increase in yield of approximately 3% was achieved.

In addition to the increase in yield, pre-machining of the billet 42 and lids prior to insertion in the liner 12 is reduced as plain cylinders without taper are effective with the present method.

The stepped nose 48 and the donut 50 are made of copper in a preferred embodiment where the "can", sheath and lids on the billet, is also copper. The copper for the donut and nose is generally of the same properties as is used in the can. Copper has proven to be strong enough to support the backward upset of material with suitable deformations (FIG. 6), while maintaining its donut characteristics.

It should be understood that in an alternative embodiment in accordance with the invention, the stepped nose 48 is not a necessity for use in conjunction with the donut 50. An improvement in yield may still be achieved when only the donut 50 is used at the tail end 24, 26 of the billet 42. An upset process that improves yield is still produced by the opposite reaction of the billet pressing upon the cone 14 prior to actual extrusion of the superconducting rod 58.

It should also be understood that in practicing the method in accordance with the invention, a donut 50 may be placed directly adjacent to the rear end 24 of the billet 42 and the disk 26 may be placed between the donut 50 and the follower block 30. Thus, the donut 50 becomes integrated in the billet 42. When the ram 32 applies its forces, the upset process occurs as described above with the same beneficial effect on the yield of superconducting rod 58.

It will thus be seen that the objects set forth above, among those made apparent from the preceding description, are efficiently attained and, since certain changes may be made in carrying out the above method without departing from the spirit and scope of the invention, it is intended that all matter contained in the above description shall be interpreted as illustrative and not in a limiting sense.

What is claimed is:

1. A method for extruding a billet to produce a superconducting rod, comprising the steps:

(a) providing a generally cylindrical superconductor core having a conductive metal sheath along its length and a first conductive metal lid at a first end and a second conductive metal lid at a second end, said sheath and lids enclosing said superconductor core and forming a composite billet;

(b) positioning said composite billet in a cylindrical liner terminating in extrusion orifice means, said composite billet having said second end and second lid proximate said orifice means;

(c) applying a first pressure on said composite billet at said first billet end, said first pressure being applied to an annular first area away from a cross-sectional center of said composite billet, said first pressure being elevated to a level causing said composite billet to press against said extrusion orifice means and causing upset flow of said composite billet toward said first billet end in an area including said cross-sectional center of said composite billet, a central portion of said composite billet moving toward said first billet end when said first pressure is applied.

2. A method as in claim 1, further comprising the step of concentrating said pressing against said orifice means to produce a reactive second pressure on said second billet end in a direction opposite to said first pressure, said second pressure being applied to said second end in a second area extending radially from said cross-sectional center to a distance less than a radius of said composite billet, said second pressure aiding and producing said upset flow.

3. A method as in claim 2, wherein said second area is circular in shape.

4. A method as in claim 1, wherein said upset flow extends the length of said central portion of said composite billet in said direction opposite to said first pressure.

5. A method as in claim 2, wherein said upset flow extends the length of said central portion of said composite billet in said direction opposite to said first pressure.

6. A method as in claim 2, wherein a sum of said first area and said second area approximately equals the cross-sectional area of said composite billet prior to application of said first and second pressures.

7. A method as in claim 6, wherein said first annular area is in a range of approximately 35% to 55% of said cross-sectional area of said composite billet.

8. A method as in claim 1, wherein said sheath is annular, the annular cross-section of the said sheath being in the order of approximately 25–50% of the cross-sectional area of said composite billet.

9. A method as in claim 1, wherein said extrusion orifice means includes a convergent cone terminating in an extrusion orifice.

10. A method for extruding a billet to produce a superconducting rod, comprising the steps:

(a) providing a generally cylindrical superconductor billet having a conductive metal sheath along its length and a first conductive metal lid at a first end and a stepped nose including a second conductive metal lid and a disc at a second end, said sheath and lids enclosing said superconductive core and forming a composite billet, said disc having a diameter less than said composite billet;

(b) positioning said composite billet in a cylindrical liner terminating in extrusion orifice means, said composite billet having said stepped nose proximate said orifice means;

(c) positioning an annular ring in said liner adjacent to said first end of said billet;

(d) applying a first pressure on said annular ring at said first billet end, said first pressure being elevated to a level causing said composite billet to press against said extrusion orifice means and causing upset flow of said composite billet toward said first billet end in an area including a cross-sectional center of said composite billet, a central portion of said composite billet moving toward said annular ring when said first pressure is applied.

11. A method as in claim 10, wherein said pressing against said orifice means produces a reactive second pressure on said second billet end in a direction opposite to said first pressure, said second pressure being applied to said second end in an area including said cross-sectional center, said second pressure aiding in producing said upset flow.

12. A method as in claim 10, further comprising the step of positioning a follower block between the annular ring and a source of said first pressure.

13. A method as in claim 10, wherein said upset flow extends the length of said central portion of said composite billet into a central opening of said annular ring.

14. A method as in claim 11, wherein a sum of the area of said disc and the area of said annular ring approximately equals the cross-sectional area of said composite billet prior to extrusion.

15. A method as in claim 14, wherein said area of said annular ring is in a range of approximately 35% to 55% of said cross-sectional area of said composite billet.

16. A method as in claim 10, wherein said sheath is annular, the annular cross-section of the said sheath being in the order of approximately 25–50% of the cross-sectional area of said composite billet.

17. A method as in claim 10, wherein said extrusion orifice means includes a convergent cone terminating in an extrusion orifice.

18. A method as in claim 10, wherein said annular ring is positioned adjacent said first lid on a side of said first lid away from said superconductor core.

19. A method as in claim 10, wherein said annular ring is positioned adjacent said first lid on a side of said first lid closer to said superconductor core.

20. A method for extruding a billet to produce a superconducting rod, comprising the steps:

(a) providing a generally cylindrical superconductor core having a conductive metal sheath along its length and a first conductive metal lid at a first end and a second conductive metal lid at a second end, said sheath and lids enclosing said superconductor core and forming a composite billet;

(b) positioning said composite billet in a cylindrical liner terminating in extrusion orifice means, said composite billet having said second end and second lid proximate said orifice means;

(c) positioning an annular ring in said liner adjacent to said first end of said composite billet;

(d) applying a first pressure on said annular ring at said first billet end, said first pressure being elevated to a level causing said composite billet to press against said extrusion orifice means and causing upset flow of said composite billet toward said first billet end in an area including a cross-sectional center of said composite billet, a central portion of said composite billet moving toward said annular ring when said first pressure is applied.

21. A method as in claim 20, wherein said upset flow extends the length of said central portion of said composite billet into a central opening of said annular ring.

* * * * *